United States Patent [19]
Thomas et al.

[11] Patent Number: 6,004,878
[45] Date of Patent: Dec. 21, 1999

[54] METHOD FOR SILICIDE STRINGER REMOVAL IN THE FABRICATION OF SEMICONDUCTOR INTEGRATED CIRCUITS

[75] Inventors: Michael E. Thomas, Milpitas, Calif.; Brian J. Daniels, Eagan, Minn.

[73] Assignee: National Semiconductor Corporation, Santa Clara, Calif.

[21] Appl. No.: 09/022,597

[22] Filed: Feb. 12, 1998

[51] Int. Cl.$^6$ .................................................. H01L 21/44
[52] U.S. Cl. .......................... 438/655; 438/656; 438/682; 438/683; 438/721; 438/724; 257/384; 257/757; 257/344
[58] Field of Search ..................................... 438/303, 234, 438/305, 694, 258, 623, 630, 634, 648, 651, 656, 682, 683, 720, 721, 724, 655; 257/384, 308

[56] References Cited

U.S. PATENT DOCUMENTS

| | | | |
|---|---|---|---|
| 4,722,909 | 2/1988 | Parrillo et al. ........................... | 438/231 |
| 5,006,911 | 4/1991 | Sivan ....................................... | 257/328 |
| 5,102,816 | 4/1992 | Manukonda et al. .................... | 438/231 |
| 5,208,472 | 5/1993 | Su et al. .................................. | 257/344 |
| 5,352,631 | 10/1994 | Sitaram et al. .......................... | 438/300 |
| 5,464,782 | 11/1995 | Koh ......................................... | 438/303 |
| 5,477,074 | 12/1995 | Yen .......................................... | 257/377 |
| 5,640,023 | 6/1997 | Balasinski et al. ........................ | 257/66 |
| 5,766,991 | 6/1998 | Chen ........................................ | 438/231 |
| 5,830,775 | 11/1998 | Maa et al. ......................... | 148/DIG. 19 |
| 5,841,173 | 11/1998 | Yamashita ................................ | 257/384 |
| 5,950,083 | 9/1999 | Inoue et al. .............................. | 438/233 |

Primary Examiner—Wael Fahmy
Assistant Examiner—William David Coleman
Attorney, Agent, or Firm—Skjerven, Morrill, MacPherson, Franklin & Friel, LLP; Edward D. Kwok

[57] ABSTRACT

Sidewall spacers, adjacent a gate electrode and source/drain regions of a MOS transistor are formed of a dielectric material that can be etched selectively to the material selected as the isolation dielectric. A layer of silicide forming metal is deposited overlying the MOS transistor and heated, wherein silicide regions are formed where the metal makes contact with silicon, for example, in the gate electrode and source/drain regions. At least a portion of the sidewall spacers are etched-away and silicide stringers, if formed on the spacers, are removed.

18 Claims, 6 Drawing Sheets

METHOD FOR SILICIDE STRINGER REMOVAL IN THE FABRICATION OF SEMICONDUCTOR INTEGRATED CIRCUITS

RELATED APPLICATION

A related application entitled "A SEMICONDUCTOR DEVICE WITH SELF ALIGNED CONTACTS HAVING INTEGRATED SILICIDE STRINGER REMOVAL AND METHOD THEREOF", Ser. No. 09/023,027, was filed on Feb. 12, 1998 concurrently herewith.

BACKGROUND

1. Field of the Invention

This invention relates to a method used in fabricating semiconductor integrated circuits, and more specifically to a method for removing silicide stringers that can form during the fabrication of MOS transistor structures.

2. Related Art

Self-ALigned metal silICIDE contact structures, commonly referred to as salicide structures, are often used in the formation of Metal Oxide Semiconductor (MOS) transistor structures to minimize contact resistance. Thus, allowing for reduction of the size of contact structures. While the formation of these salicide structures require several process steps, advantageously, none is a masking step; hence, processes for the formation of salicide structures are widely used.

In one known salicide process for a MOS transistor, source and drain (S/D) regions are formed aligned to a gate electrode structure and/or any sidewall spacers that may be used. A blanket metal layer is deposited so that silicon, at the upper surface of source, drain and gate regions, is in contact with the metal. The wafer is then heated to a temperature sufficiently high for the metal and silicon, in contact with one another, to undergo a reaction and form a metal silicide. The unreacted metal is then removed, and regions of metal silicide are revealed. Thus, by employing a salicide process, regions of metal silicide are formed aligned, without benefit of a masking step, in this example to S/D and gate regions. During the salicide process, the sidewall spacers serve to prevent bridging of the gate silicide region with either the source or drain silicide regions. After removal of the metal not reacted to form a silicide, a second, higher temperature silicide anneal step is often employed to stabilize the silicide regions formed and to provide the lowest possible silicide resistivity.

However, as device geometries become smaller, the width of sidewall spacers becomes smaller. As a result, bridging of-adjacent silicide regions across these smaller spacers, due to remnants of the metals layer or stringers, becomes an increasingly serious problem. This stringer formation and the resultant bridging can occur due to a variety of reasons that are enhanced by the smaller spacers. For example, a limited reaction of the spacer material with the metal, or migration of silicon on the surface of the spacer can result in silicide stringers which are resistant to the selective metal etch. Alternatively the stringer formation can be due to any one of a variety of physical reasons, such as non-uniformities in the initial metal film deposition or the metal etch process. While some process alterations or optimization can help alleviate the stringer problem, often stringer formation cannot be eliminated through such means, and yield loss due to electrical shorts caused by such stringers result.

Thus it would be advantageous to have a method of forming a semiconductor integrated circuit having silicide enhanced contact regions that would provide for the removal of any silicide stringers that might form. In addition, it would be advantageous for such a silicide stringer removal process to be compatible with MOS transistor processing and not require any additional masking steps. Finally, it would be advantageous for the silicide stringer removal process to allow a choice of transistor isolation processes, for example a local oxidation of silicon (LOCOS) process or a trench isolation process.

SUMMARY

In accordance with the present invention, a method for removing silicide stringer is enabled in a process for forming a MOS transistor. A gate electrode structure is provided overlying a semiconductor substrate. Sidewall spacers are formed adjacent to the gate electrode and provide spacing between the subsequently formed S/D regions and the areas under the gate electrode structure. A source and a drain region are formed within the substrate, these S/D regions aligned to the gate electrode structure. In some embodiments a metal layer is formed overlying exposed areas of the gate electrode and S/D regions and the substrate is heated to a temperature sufficiently high for the metal layer to react and form silicide regions in the exposed areas. In some embodiments of the present invention, metal gate electrodes are employed and no silicide region overlying the gate electrode is formed. The sidewall spacers are selectively etched, with respect to any like material in isolation or other regions, and silicide stringers, if any, are removed. After stringer removal, a dielectric layer is formed overlying the substrate, and the layer is patterned to provide contact openings or vias over predetermined regions.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where elements are common between illustrations, common numbering of those elements is employed between illustrations.

DETAILED DESCRIPTION

As embodiments of the present invention are described with reference to the drawings, various modifications or adaptations of the specific methods and or structures may become apparent to those skilled in the art. All such modifications, adaptations or variations that rely upon the teachings of the present invention, and through which these teachings have advanced the art, are considered to be within the spirit and scope of the present invention. For example, in some embodiments of the present invention silicide stringers are removed after a high temperature silicide forming and anneal step. In other embodiments silicide stringers are removed in-between a low temperature silicide forming step and a high temperature silicide anneal step.

Figure 1:
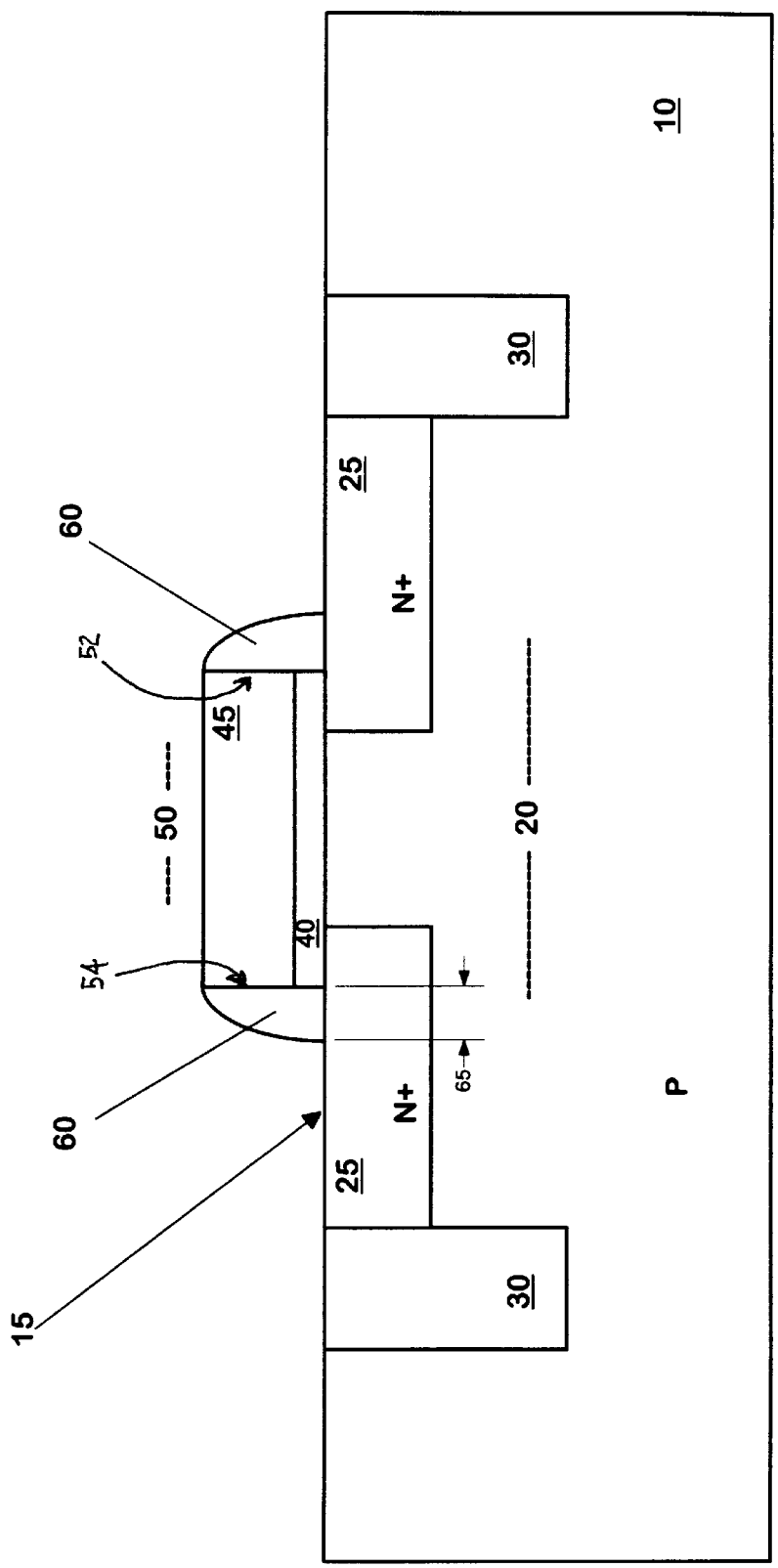
FIGS. 1–6 are cross-sectional representations of various stages in the formation of an MOS transistor that incorporates a silicide stringer removal process in accordance with an embodiment of the present invention.

FIG. 1 is a simplified cross-sectional view of an intermediate stage in the fabrication of a MOS transistor in the manner of the present invention. A semiconductor wafer 10 is shown having shallow trench isolation regions 30. While wafer 10 is depicted as a P-type silicon substrate 10 having a minimum of complexity, other types of substrates may be advantageously employed. For example, substrate 10 can be an N-type substrate, or can be an N or P-type substrate encompassing N and/or P-type well regions (not shown) and/or an epitaxial layer (not shown). Alternatively, substrate 10 can encompass a silicon on insulator (SOI) structure, or other appropriate semiconductor substrate material or structure. In addition, while FIG. 1 depicts isolation regions 30 as shallow trench isolation regions 30, other appropriate methods of isolation can be also employed. For example, regions 30 can be formed using any of the LOCOS or LOCalized Oxidation of Silicon isolation methods.

A gate dielectric layer 40 is formed on upper surface 15, overlying an active area 20 defined by upper surface 15 and isolation regions 30. Gate dielectric layer 40 is typically a silicon oxide layer formed in the range of approximately 3 to 8 nanometers (nm), although other appropriate thicknesses or material can be used. For example, gate dielectric layer 40 can be formed as a composite layer of chemical vapor deposited (CVD) oxide and thermal oxide, or of a nitrided oxide material, as known. In addition, gate dielectric layer 40 can be formed as a composite layer of silicon oxide and silicon nitride, or formed of one of the high dielectric materials such as tantalum pentoxide ($Ta_2O_5$) or combinations thereof.

A gate electrode layer 45 is formed overlying gate dielectric layer 40. Gate electrode layer 45 is typically a polysilicon material having a thickness of between approximately 200 to 350 nm, although amorphous silicon, a combination of amorphous silicon and polysilicon can be used to form gate electrode layer 45. In addition, in some embodiments in accordance with the present invention, it is advantageous to employ a metal gate electrode layer 45, such as tungsten (W), molybdenum (Mo) or tantalum (Ta). For example, in some embodiments a W gate electrode 45 can be advantageously used with a $Ta_2O_5$ gate dielectric layer 40. Alternatively, in some embodiments it is advantageous to employ a Mo or Ta gate electrode 45 overlying a silicon oxide gate dielectric layer 40 having an intervening barrier layer such as titanium/titanium nitride (NOT SHOWN).

Where gate electrode layer 45 encompass a silicon material, such layers are typically deposited as a doped layer (in-situ doping) and/or doped concurrently with the doping of other regions, for example source and drain regions 25. Typically, such layers 45 are deposited having a thickness between approximately 200 to 400 nm. Where gate electrode layer 45 is a metal layer, such layers are typically deposited using physical vapor or chemical vapor deposition methods having a thickness between approximately 80 to 200 nm. Once formed, layers 40 and 45 are patterned, using well known photolithography and etch techniques to form a gate structure 50 overlying a portion of active area 20, as depicted.

FIG. 1 shows source and drain (S/D) regions 25 formed adjacent to opposite sides 52 and 54 of gate structure 50 in active area 20. Formation of S/D regions 25 can be accomplished using any of the variety of methods that have been developed to form S/D regions 25 and that are tailored for specific performance requirements. As known, there are many such methods for forming S/D regions 25. Thus, in some embodiments of the present invention, a method to form lightly doped drain (LDD) S/D regions 25 can be employed, while in other embodiments other appropriate methods for forming S/D regions 25 can be used. Notwithstanding the method used to form S/D regions 25, where semiconductor wafer 10 is a P-type substrate, or active area 20 encompasses a P-type well structure (not shown), S/D regions 25 are doped N-type, as shown in FIG. 1. Alternatively, where wafer 10 is N-type or area 20 encompasses an N-type well region (not shown), S/D regions 25 are P-type (NOT SHOWN).

In some embodiments of the present invention, sidewall spacers 60 are employed during formation of S/D regions 25. In some embodiments, a dielectric material is deposited as a blanket dielectric layer (not shown) and anisotropically etched to form spacers 60. The anisotropic etch process selected is selective to both the material of isolation regions 30 and substrate 10. Typically, the dielectric material selected is a CVD or PECVD (Chemical Vapor Deposition or Plasma Enhanced CVD) silicon oxide material. In some embodiments, materials other than silicon oxide and/or a combination of materials is employed. Thus, spacers 60 can be formed using silicon oxide, silicon nitride, or a combination of oxide and nitride, as will be discussed hereinafter, and typically overlie portions of each SID region 25, as depicted.

Width 65 of spacers 60 is controlled, in significant part, by the thickness of the layer of dielectric material deposited. Typically width 65 is between approximately 80 to 100 nm, hence, the dielectric layer is deposited having a thickness at least equal to width 65. Where sidewall spacers 60 are used in conjunction with the formation of S/D regions 25, for example S/D regions 25 employing an LDD process, the specific order of processing depends from the specific SID method selected, as known. In some embodiments of the present invention, where spacers 60 are not used to form S/D regions 25, they are, however, appropriately formed to provide adequate spacing for silicide formation as will be discussed hereinafter.

Figure 2:
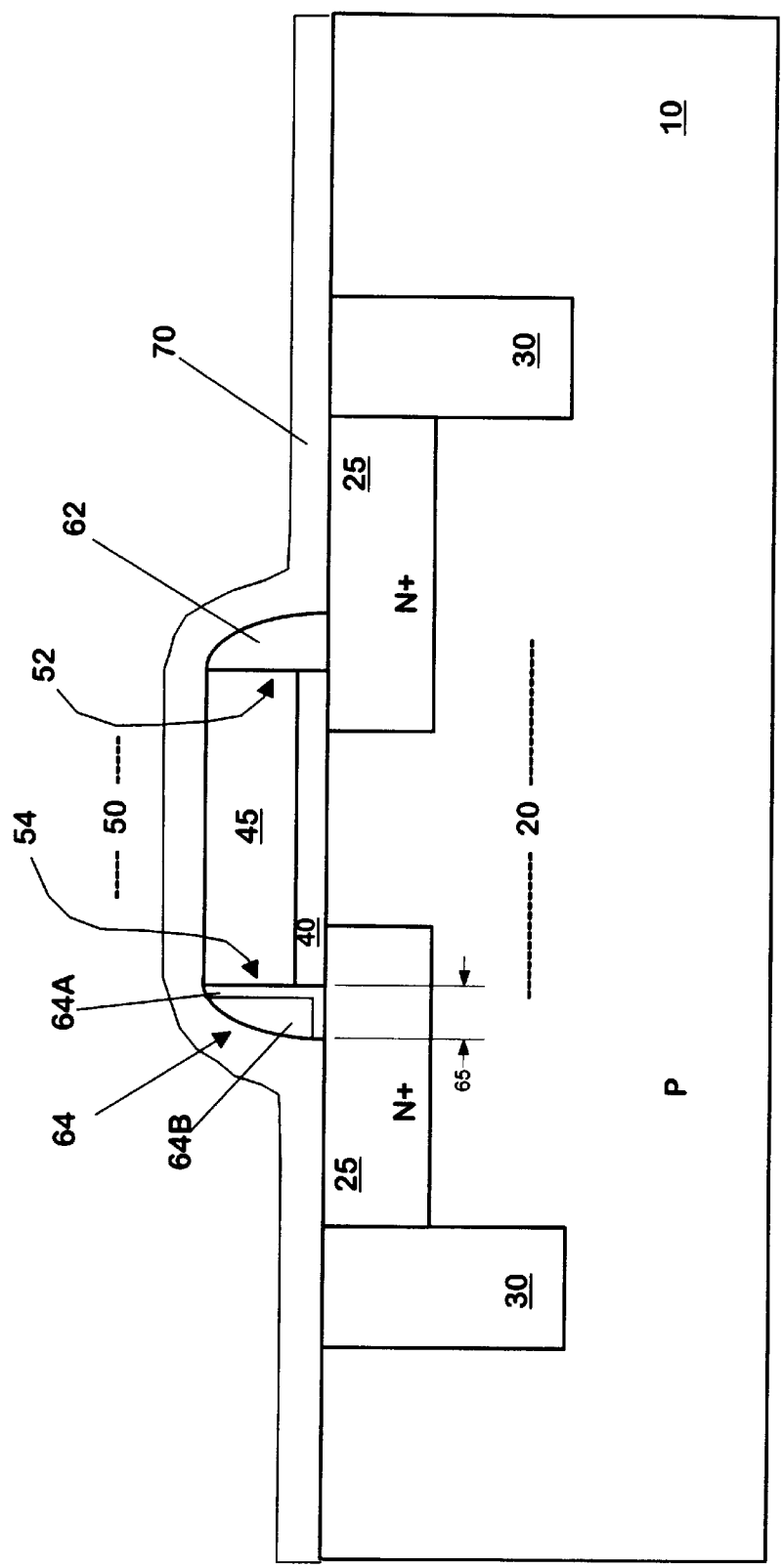

Referring now to FIG. 2, two embodiments of spacers 60, depicted FIG. 1, are illustrated. In the first of these embodiments, a first spacer 62 is shown adjacent edge or sidewall 52 of gate structure 50. In the second embodiment a second spacer 64 is shown adjacent edge 54. It should be understood that these two embodiments are illustrated using FIG. 2 for convenience only, and that each embodiment of the present invention uses one of the alternate spaces described below, of gate structure 50. As previously discussed, spacers 60 (FIG. 1) can be formed of a single material or combination of materials. Thus, as depicted, first spacer 62 is formed with an essentially uniform body and is representative of a silicon oxide or silicon nitride spacer formed from a uniform oxide or nitride layer. On the other hand, second spacer 64 has a first portion 64A and a second portion 64B and is representative of a spacer formed from a layer that is a combination of dielectric materials, e.g. silicon oxide and silicon nitride, respectively. Thus some embodiments of the present invention are practiced using first spacer 62 and other embodiments using second spacer 64.

First portion 64A is preferably a thin oxide material formed as a layer (not shown) approximately 10 to 30 nm thick overlying substrate 10 and gate structure 50. Where gate electrode layer 45 is formed of a metal material, first portion 64A is preferably formed by a chemical vapor deposition (CVD) process. Where gate electrode layer 45 is formed of a silicon material, first portion 64A is preferably formed by a thermal oxidation process, although a CVD process is also appropriate. Where first portion 64A is an oxide material, second portion 64B is preferably a silicon nitride material initially formed by a CVD or PECVD process as a layer (not shown) approximately 50 to 80 nm thick, overlying the silicon oxide layer (not shown); where the total thickness of the combined layer is between approximately 80 to 100 nm. In some embodiments, this combination layer of silicon oxide and silicon nitride, is subsequently anisotropically etched using a first etch process to etch the silicon nitride and a second process to etch the silicon oxide, preferably as a single sequential etch process to form second spacer 64. In some embodiments a single etch process is employed, where the etch process selected has limited selectivity between silicon oxide and silicon nitride.

FIG. 2 also depicts a blanket layer of metal 70 deposited after the formation of spacers 62 or 64 and overlying exposed regions of S/D regions 25 and gate structure 50. Metal layer 70 is selected to be a material capable of forming a metal silicide if heated above a threshold temperature when in contact with silicon (Si). For example, cobalt (Co) reacts to form cobalt silicide ($CoSi_2$). Other metals that form silicides include tungsten (W), tantalum (Ta), hafnium (Hf), molybdenum (Mo), neodymium (Nd) and zirconium (Zr), as well as titanium (Ti), and several of the Group VIII metals such as platinum (Pt), palladium (Pd) and nickel (Ni). While any of the silicide forming metals can be used to form metal layer 70, typically either Co or Ti is employed, as the silicides they form, and the silicide formed from Ni, have the lowest resistivities. Thus, while embodiments of the present invention can encompass any silicide forming metal, it has been found advantageous to form metal silicides using either Co or Ti. Hence, in some embodiments a layer of Co is for example sputter deposited approximately 25 to 60 nm thick to form metal layer 70, while in other embodiments a layer of Ti is similarly deposited. It will be noted, that where gate electrode layer 45 is a metal material, typically a metal is selected for layer 70 that can be selectively etched with respect to the material of layer 45, as will be described hereinafter.

Figure 3:
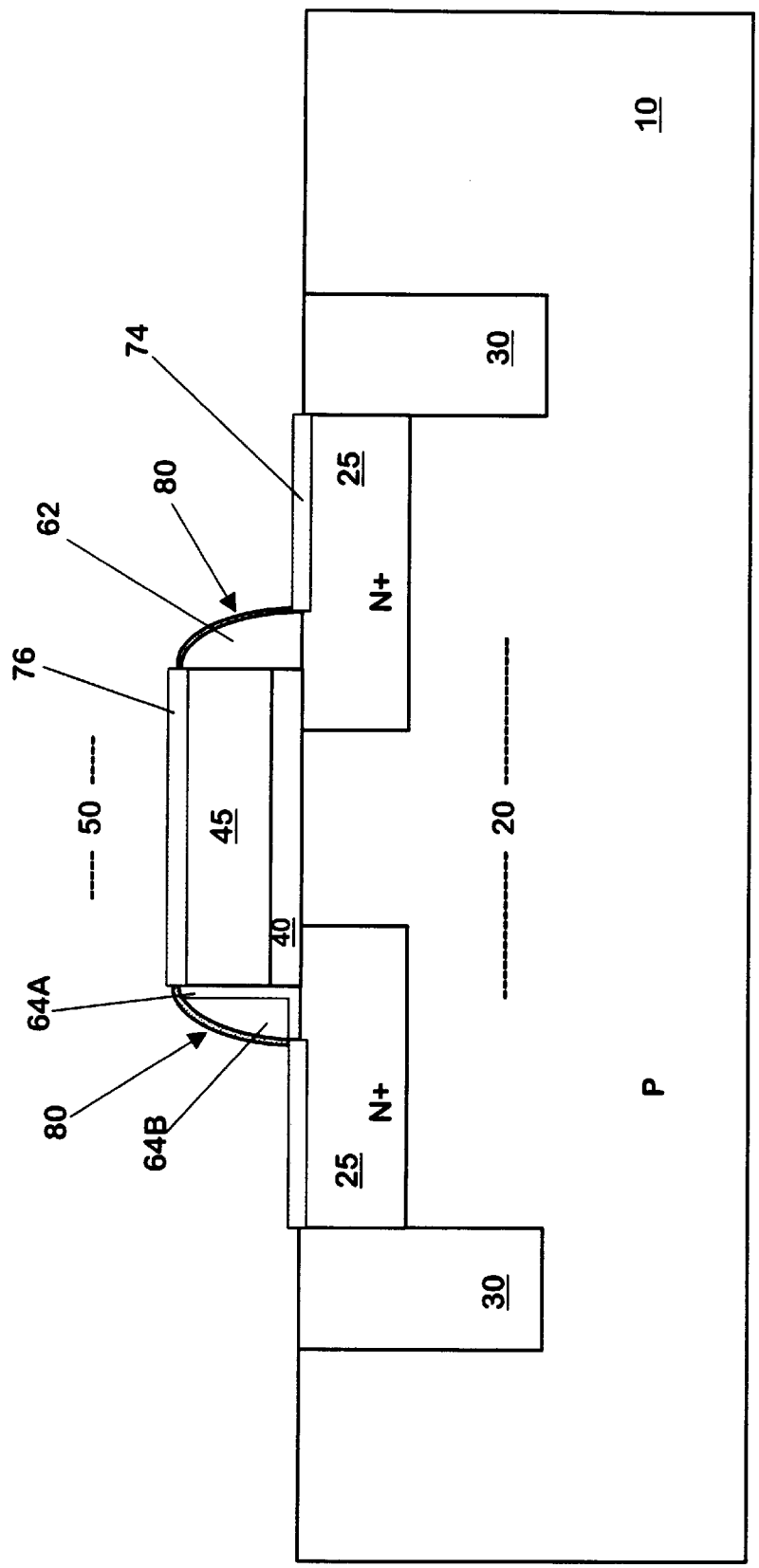

FIG. 3 illustrates the structure of FIG. 2 having a gate electrode layer 45 formed of a silicon material after a heating or silicide formation step and removal of unreacted metal. A S/D silicide region 74 is formed in each S/D region 25, and a gate silicide region 76 is formed in gate structure 50. As known, each silicide region (74, 76) is formed by the reaction of exposed silicon regions, such as upper portions of S/D regions 25 and gate layer 45, with the metal of layer 70 (FIG. 2). The thickness of the silicide regions (74, 76) formed is dependent, among other things, upon the specific metal used for metal layer 70, its thickness, the doping of the underlying silicon region and the temperature and time at that temperature employed in the silicide forming step. Thus, for a metal layer 70 having a thickness between approximately 25 to 60 nm and heated to a first temperature between approximately 400 to 750° centigrade (C.) for between 30 and 120 seconds in a rapid thermal processor, a thickness of approximately 10 to 60 nm for silicide regions 74 and 76 is typical. Where gate electrode layer 45 is a metal material, the silicide region 76 is not formed.

During the forming step of silicide regions 74 and 76, in embodiments encompassing a gate electrode layer 45 formed of a silicon material, not all of metal layer 70 (FIG. 2) overlying regions of exposed silicon is necessarily converted to metal silicide. Also, where gate electrode layer 45 encompasses a metal material, portions of metal layer 70 (FIG. 2) overlying gate layer 45 are not converted to a metal silicide. Typically, this unreacted metal, if any, is removed. To accomplish this removal, an etch process that selectively removes unreacted metal is used. For example, in embodiments where metal layer 70 is Co, one such mixture is referred to as PAN etch (Phosphoric, Acetic and Nitric acids) and used to remove unreacted Co in the presence of $CoSi_2$. In embodiments where gate electrode material 45 encompasses a metal material, for example W, and metal layer 70 is Co, PAN etch can be used to remove unreacted Co in the presence of $CoSi_2$ and W. In some embodiments of the present invention, once unreacted metal is removed, substrate 10 is heated to a second temperature, typically higher than the first temperature, to complete the formation of any metal silicide regions 74 and 76 present.

Additionally, FIG. 3 depicts stringers 80 overlying spacers 62 and 64. It will be understood that while stringers 80 are depicted overlying both spacers 62 and 64, this is for illustrative purposes only. The undesirable formation of stringers 80 can result in electrical coupling of region 74 to region 76, or where a metal gate electrode 45 is used, directly to electrode 45. Stringers 80 can be formed due to a variety of factors. For example, where spacer 62 is silicon oxide, silicon from substrate 10 or gate structure 50 can migrate to and over the surface of spacer 62. This surface silicon can then react to form metal silicide as stringer 80. Shrinking device geometries that results in smaller spacers 62, i.e. reduced width 65, make such Si migration easier and stringer formation a more serious problem.

As the thickness typically employed for a metal gate layer 45, as compared to a silicon gate electrode layer 45, is much reduced, the formation of stringers 80 can still be a serious problem despite the lack of Si migration from such a metal layer 45. To reduce such stringer formation, alternative processes or process modifications have been developed. For example, the temperature of the initial silicide forming step is reduced or the time at the elevated temperature is shortened. However, it has been found that while such alterations and/or modifications of the silicide forming process can alleviate stringer formation, they cannot reliably eliminate it. Stringers 80 can also form due to non-uniformities in processing. Thus, variations in the thickness of metal layer 70 (FIG. 2), the temperature during silicide formation or the uniformity of the selective etch used to remove any unreacted metal also result in the formation of stringers 80. Hence, it can be seen that a method to completely remove stringers 80 would be desirable.

Figure 4:
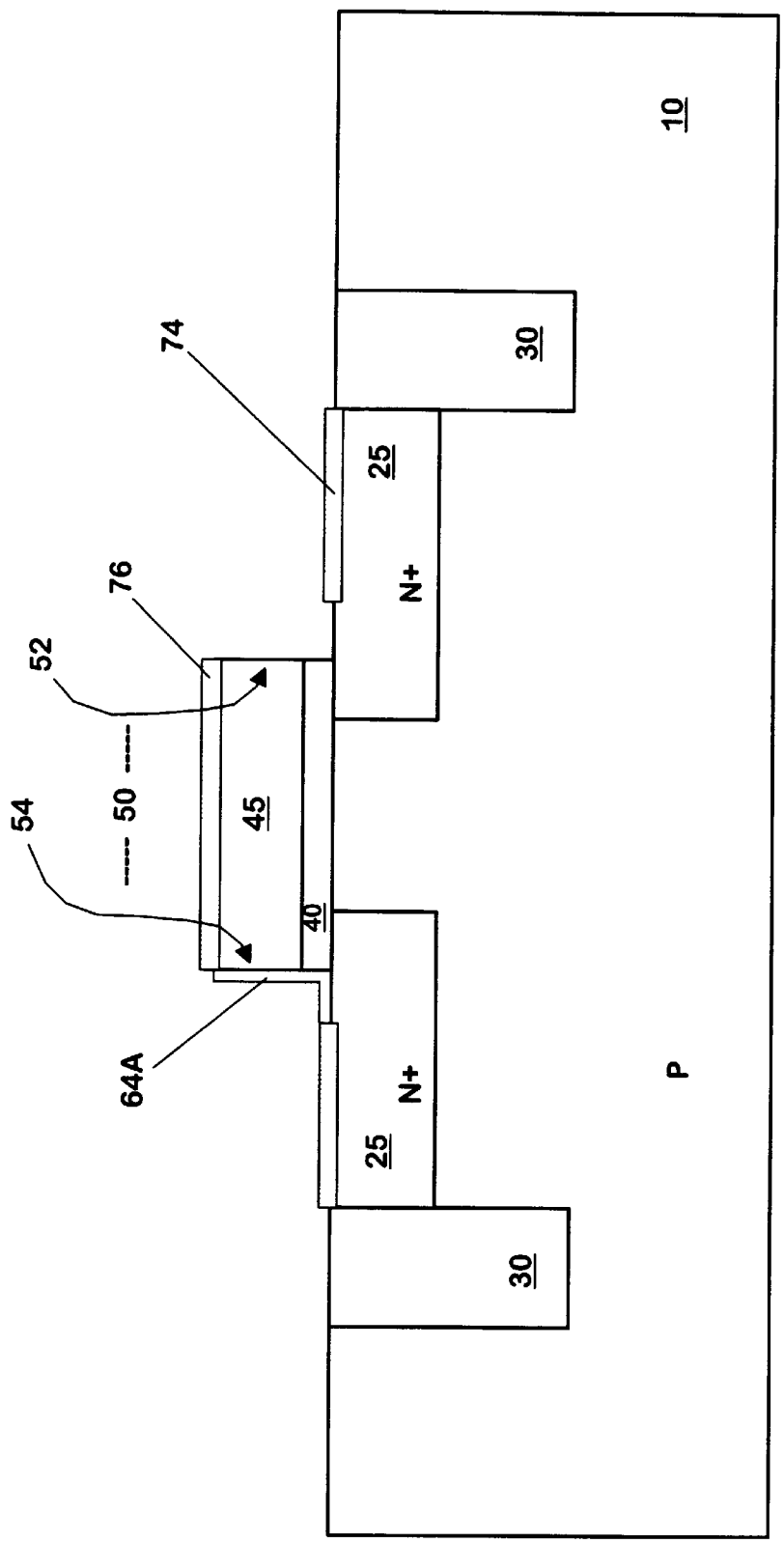

Turning now to FIG. 4, the structure of FIG. 3 is shown illustrating the result of alternative stringer removal steps in accordance with embodiments of the present invention. As seen in FIG. 4, adjacent edge 52 of gate structure 50, spacer 62, shown in FIG. 3, has been removed in accordance with some embodiments of the present invention. In so doing, stringer 80 (FIG. 3) is also removed. For embodiments of the present invention that employ spacers 64 (FIG. 3), stringers 80 can be eliminated by removal of all of spacer 64 (FIG. 3) or by removal of second portion 64B (FIG. 3) only. Where only portion 64B is removed, portion 64A advantageously remains to protect the edges of gate layer 45 and gate dielectric 40, as depicted. There are a variety of methods for removing spacers 62 and 64 in accordance with the present invention. For example, some embodiments of the present invention have spacers 62 (FIG. 3) formed of a phosphorus doped silicon oxide. Phosphorus doped silicon oxide spacers 62 (FIG. 3) are rapidly etched-away using a dilute aqueous hydrogen fluoride (HF) solution. As known, a dilute HF solution will also remove silicon oxide from isolation regions 30, however, the amount of silicon oxide removed from regions 30 is minimized as the phosphorus doped spacer material etches significantly faster than the isolation oxide, as much as thirty times faster or more. In this manner, the time required to completely remove phosphorus doped silicon oxide spacer 62 (FIG. 3) is sufficient to remove only a small portion of oxide from regions 30. Embodiments employing spacers 64 (FIG. 3) having a silicon nitride portion 64B (FIG. 3), on the other hand, are etched using phosphoric acid. As one of ordinary skill will know, phosphoric acid will remove silicon nitride portion 64B (FIG. 3)

with essentially no etching of silicon oxide. Thus, the etch solution used and the material selected for spacers 62 and 64 (FIG. 3) provide selectivity between spacer material and isolation oxides.

It should be realized that in some embodiments employing uniform spacer 62 depicted in FIG. 3, stringers 80 (FIG. 3) can also be removed by etching only a portion spacer 62. Thus, only some material from spacers 62 (FIG. 3) need be removed to "lift-off" stringers 80 from the underlying spacer 62 (FIG. 3). Thus, some embodiments of the present invention remove stringer 80 by removing only that portion of spacers 62 sufficient to allow "lift-off" of stringer 80. In this manner, embodiments of the present invention can be employed where etch selectivity between spacer material and isolation material is low.

Figure 5:
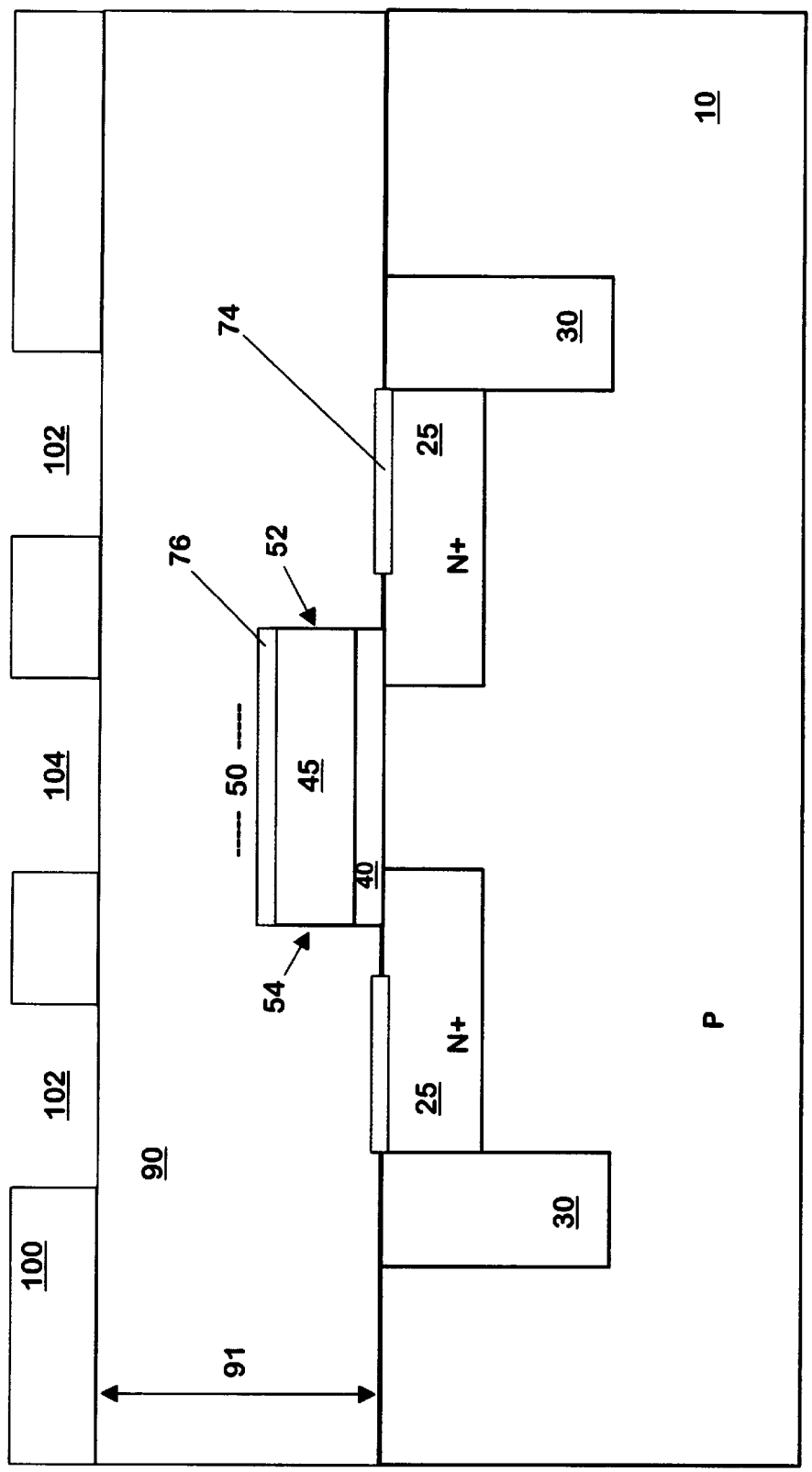

Turning now to FIG. 5, the structure of FIG. 4 is shown once stringer removal is complete and a dielectric layer 90 is formed overlying substrate 10. Dielectric layer 90 can encompass a number of materials such as silicon oxide, silicon oxynitrides or the like. In some embodiments, dielectric layer 90 encompasses multiple materials. While methods of forming layer 90 and its thickness depend upon the specific material(s) selected, typically a thickness 91 of approximately 0.5 to 1.2 microns ($\mu$m) is employed. For example, where layer 90 is a silicon oxide material, a CVD or PECVD process is typically employed.

Some embodiments of the present invention employing a silicon gate electrode layer 45, use a thermal oxidation step performed just prior to deposition of layer 90. In this manner, a thin oxide layer (not shown) is formed adjacent edges 52 and 54, of gate structure 50. Formation of this thin oxide layer, typically 5 to 10 nm thick, can serve to protect gate structure 50 during deposition of dielectric layer 90. In addition, after deposition of dielectric layer 90, some embodiments of the present invention employ a planarization process, e.g. chemical mechanical polishing (CMP), to planarize layer 90. Also shown in FIG. 5 is a masking layer 100 formed and patterned to expose predetermined areas 102 and 104 of layer 90. Masking layer 100 is typically a photoresist material and the formation of layer 100 and its patterning, to define areas 102 and 104, is performed using standard processing methods, as known.

Figure 6:
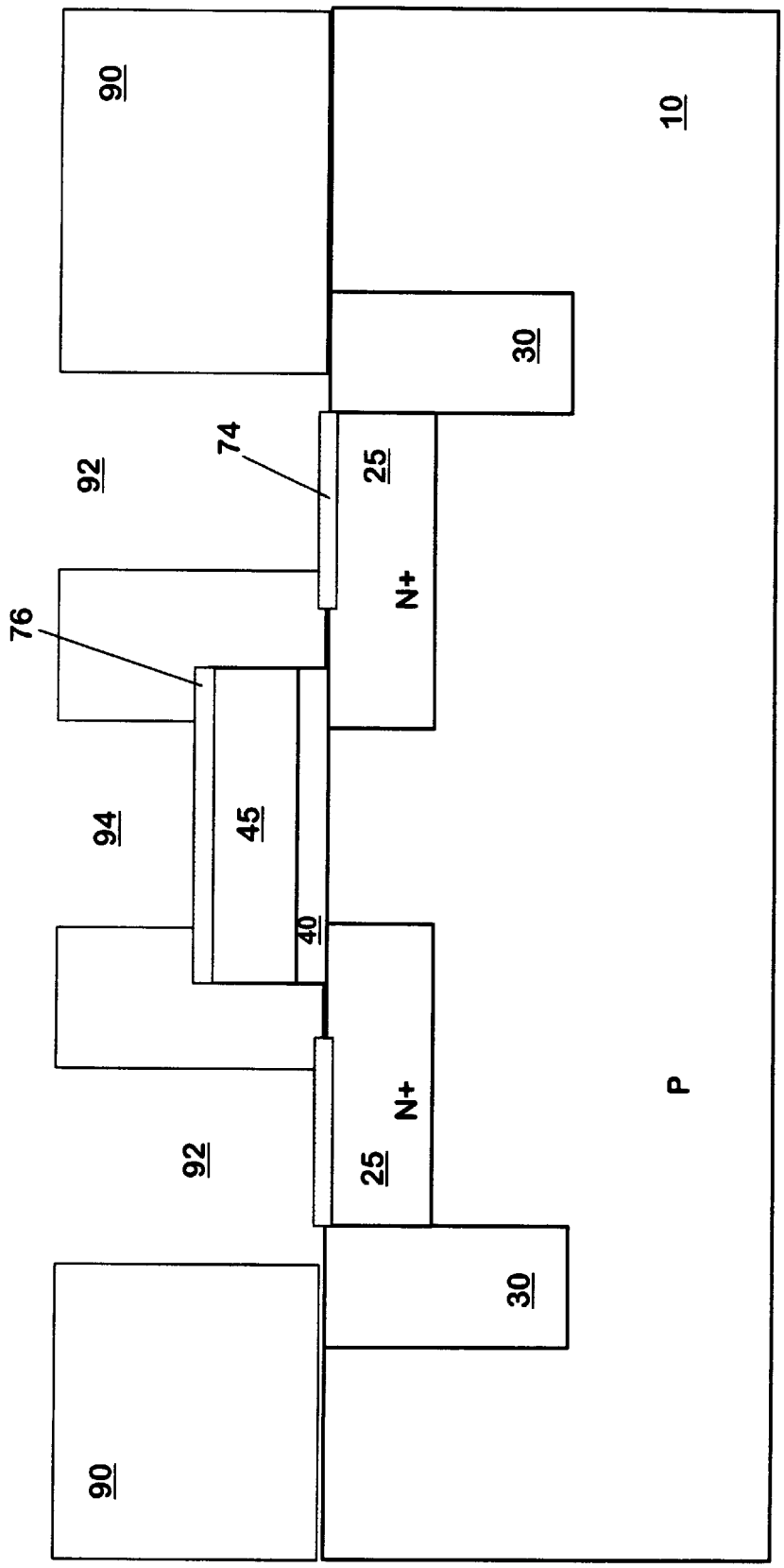

Referring now to FIG. 6, the structure of FIG. 5 is shown after dielectric layer 90 has been etched to form S/D contact openings 92 and gate contact opening 94, and masking layer 100 removed. Contact openings 92 and 94 are typically formed using an anisotropic etch process as is known. For example, where layer 90 is a PECVD silicon oxide material, a plasma etch process using a freon and oxygen chemistry will advantageously form openings 92 and 94. Where gate layer 45 is a silicon material, opening 94 exposes silicide region 76, as depicted. Where gate layer 45 is a metal material, opening 94 exposes an upper surface of gate layer 45 (not shown).

By now it will be realized that embodiments of the present invention have been described that provide for the removal of silicide stringers that may form during a salicide process employed for the fabrication of a MOS transistor. It will also be realized that the embodiments of the present invention described are compatible with standard MOS transistor processing employing gate structures having silicon gate layers or metal gate layers. Additionally, it will be realized that the embodiments described do not require additional masking steps to effect removal of silicide stringers or form the direct gate contacts. Finally, it will be realized that embodiments of the present invention have been described that are compatible with both trench isolation and LOCOS isolation methods, as well as a variety of semiconductor substrate types.

We claim:

1. A method of forming a MOS integrated circuit, comprising the steps of:

providing a gate electrode structure;

forming a sidewall spacer adjacent each opposite sidewall of said gate electrode structure, said sidewall spacer being formed of a material selected from the group consisting of silicon oxide, phosphorus doped silicon oxide and silicon nitride, each spacer overlying a portion of a source region or a drain region proximate said gate electrode structure;

depositing a metal layer overlying exposed portions of said gate electrode structure, source and drain regions and sidewall spacers, wherein said metal layer is a silicide forming material;

forming metal silicide regions coincident to said exposed portions of said source and drain regions;

removing unreacted metal of said metal layer; and etching said sidewall spacers, wherein at least a portion of said sidewall spacers is etched away.

2. The method of claim 1 further comprising forming a metal silicide region coincident to exposed portions of said gate electrode structure.

3. The method of claim 1 wherein forming a sidewall spacer adjacent each opposite sidewall of a gate electrode structure comprises forming said sidewall spacers having a first silicon oxide portion adjacent each sidewall, overlaid by a second silicon nitride portion.

4. The method of claim 1 wherein depositing a metal layer comprises depositing a metal layer selected from a group consisting of Co, Ti, W, Ta, Mo, Pt, Pd, Nd, Zr, Hf and Ni.

5. The method of claim 1 wherein depositing a metal layer comprises depositing a Co or a Ti metal layer.

6. The method of claim 1 further comprising forming an isolation region, wherein an active area for subsequently forming said gate electrode structure and said source and drain regions, is defined by said isolation region.

7. The method of claim 5, wherein forming an isolation region comprises forming a LOCOS or a trench isolation region.

8. The method of claim 1 wherein forming metal silicide regions comprise heating to a temperature between approximately 400 to 750° centigrade.

9. The method of claim 1 wherein etching said sidewall spacers comprises etching-away essentially all of said sidewall spacers.

10. The method of claim 1 wherein providing a gate electrode comprises forming a gate layer comprising a material selected from the group consisting of polysilicon, amorphous silicon, tungsten, molybdinum, tantalum and combinations thereof, overlying a gate dielectric layer.

11. A method for forming a MOS transistor with silicide stringers removed, comprising the steps of:

providing a semiconductor wafer having an upper surface comprised of silicon;

forming an isolation region in said wafer, wherein an active area, adjacent said upper surface, is defined by said isolation region;

forming a gate dielectric overlying at least a portion of said active area;

forming a gate electrode overlying said gate dielectric;

forming a source region and a drain region, in said active area, adjacent opposite sidewalls of said gate electrode;

forming sidewall spacers adjacent each of said opposite sidewalls and overlying a portion of said source and drain regions, said sidewall spacers being formed of a material selected from the group consisting of silicon oxide, phosphorus doped silicon oxide and silicon nitride;

depositing a blanket silicide forming metal layer overlying said semiconductor wafer, wherein said metal layer is in contact with the silicon of an upper surface of said source and drain regions;

heating said substrate to a first temperature, wherein said first temperature is sufficiently high for said metal layer to react to form metal silicide regions;

selectively etching said metal layer, wherein unreacted metal of said metal layer is removed; and etching said sidewall spacers, wherein at least a portion of said sidewall spacers is etched away.

12. The method of claim 11 wherein forming a gate electrode comprises forming a gate electrode with a material selected from the group consisting of polysilicon, amorphous silicon, tungsten, molybdinum, tantalum and combinations thereof.

13. The method of claim 11 wherein forming an isolation region comprises forming a LOCOS isolation region or a trench isolation region.

14. The method of claim 11 wherein heating said substrate to a first temperature comprises heating said substrate to a temperature between approximately 400 to 750° centigrade.

15. The method of claim 11 comprising heating said substrate to a second temperature higher than said first temperature.

16. The method of claim 11 wherein depositing a blanket silicide forming metal layer comprises depositing a metal layer selected from a group consisting of Co, Ti, W, Ta, Mo, Pt, Pd, Nd, Zr, Hf and Ni.

17. The method of claim 11 wherein depositing a blanket silicide forming metal layer comprises depositing a Co or a Ti metal layer.

18. The method of claim 11 wherein etching said semiconductor wafer using an etchant selective to said sidewall spacers comprises etching-away essentially all of said sidewall spacers.

* * * * *